US010602620B2

(12) United States Patent
Miki et al.

(10) Patent No.: US 10,602,620 B2
(45) Date of Patent: Mar. 24, 2020

(54) LAMINATE FOR PRINTED WIRING BOARD, METHOD OF MANUFACTURING PRINTED WIRING BOARD, AND METHOD OF MANUFACTURING ELECTRONIC DEVICE

(71) Applicant: JX Nippon Mining & Metals Corporation, Tokyo (JP)

(72) Inventors: Atsushi Miki, Ibaraki (JP); Kazuki Kanmuri, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 322 days.

(21) Appl. No.: 15/426,435

(22) Filed: Feb. 7, 2017

(65) Prior Publication Data

US 2017/0231101 A1    Aug. 10, 2017

(30) Foreign Application Priority Data

Feb. 9, 2016  (JP) ................................. 2016-023187

(51) Int. Cl.
*H01L 29/12* (2006.01)
*H05K 3/46* (2006.01)
(Continued)

(52) U.S. Cl.
CPC .......... *H05K 3/4644* (2013.01); *H05K 1/028* (2013.01); *H05K 1/09* (2013.01); *H05K 3/06* (2013.01);
(Continued)

(58) Field of Classification Search
None
See application file for complete search history.

(56) References Cited

U.S. PATENT DOCUMENTS

2013/0071652 A1* 3/2013 Yamanishi .............. B32B 15/08
428/336
2013/0098665 A1* 4/2013 Ishii ........................ H05K 3/108
174/254

FOREIGN PATENT DOCUMENTS

CN    102782174 A  * 11/2012  ............... C22C 9/00
JP    2006-278950 A    10/2006
(Continued)

OTHER PUBLICATIONS

Tomohiro Senkawa, machine translation JP 2007-107038, Apr. 26, 2007 (Year: 2007).*

(Continued)

*Primary Examiner* — David Sample
*Assistant Examiner* — Mary I Omori
(74) *Attorney, Agent, or Firm* — Nields, Lemack & Frame, LLC

(57) ABSTRACT

A laminate for printed wiring board is used in a method of manufacturing printed wiring boards that includes a process of forming a circuit by any one of a semi-additive method, a partly additive method, a modified semi-additive method, and an embedding method. The laminate includes an insulating resin substrate, a metal layer 1 and a metal layer 2 in this order. When a cross section that is parallel to the thickness direction of the laminate is processed by means of ion milling and the cross sections of the metal layer 1 and the metal layer 2 were observed with EBSD, each of the metal layer 1 and the metal layer 2 has one or plural crystal grain(s) at the processed cross section, and an area ratio of the total area of crystal grains of which a difference in angle of the <100> crystal direction from a perpendicular of the processed cross section is 15° or less from among the one or plural crystal grains to the total area of the plural crystal (Continued)

grains was 15% or higher but less than 97% in the metal layer 1 and the metal layer 2.

18 Claims, 1 Drawing Sheet

(51) Int. Cl.
- *H05K 1/09* (2006.01)
- *H05K 1/02* (2006.01)
- *H05K 3/06* (2006.01)
- *H05K 3/10* (2006.01)
- *H05K 1/03* (2006.01)
- *H05K 3/02* (2006.01)

(52) U.S. Cl.
CPC ............ *H05K 1/0393* (2013.01); *H05K 3/022* (2013.01); *H05K 3/108* (2013.01); *H05K 2201/032* (2013.01); *H05K 2201/0338* (2013.01); *H05K 2201/0355* (2013.01); *H05K 2201/05* (2013.01); *H05K 2203/0502* (2013.01)

(56) References Cited

FOREIGN PATENT DOCUMENTS

| | | | |
|---|---|---|---|
| JP | 2007107038 A | * | 4/2007 |
| JP | 2011-14848 A | | 1/2011 |
| WO | 2011/136061 A1 | | 11/2011 |

OTHER PUBLICATIONS

Hattori et al., machine tanslation of CN 102782174, Nov. 14, 2012 (Year: 2012).*

* cited by examiner

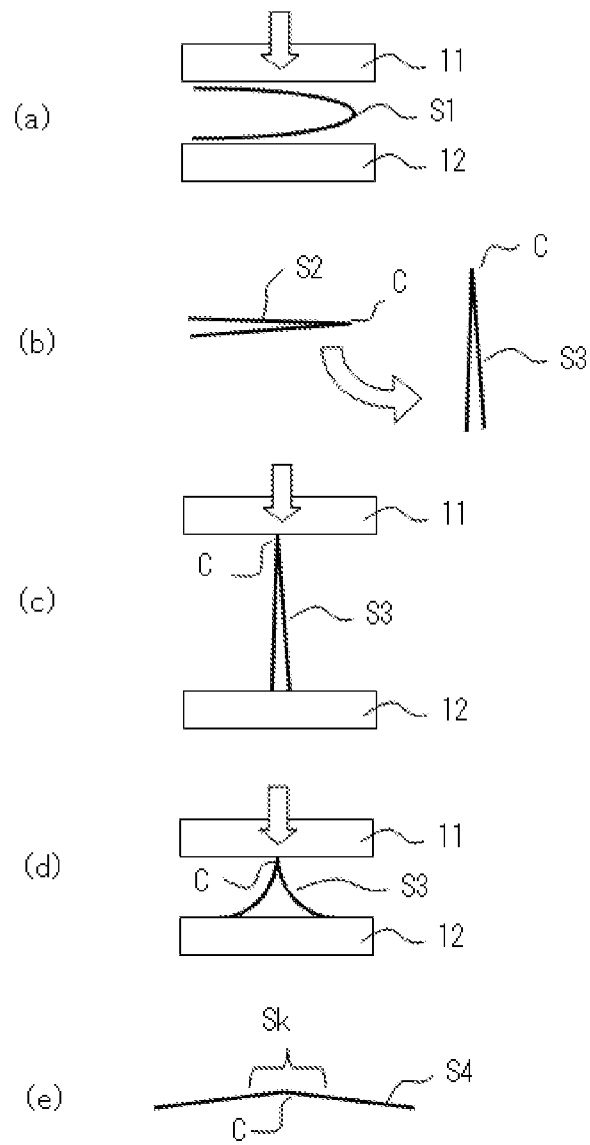

LAMINATE FOR PRINTED WIRING BOARD, METHOD OF MANUFACTURING PRINTED WIRING BOARD, AND METHOD OF MANUFACTURING ELECTRONIC DEVICE

TECHNICAL FIELD

The present invention relates to a laminate for a printed wiring board, a method of manufacturing a printed wiring board, and a method of manufacturing an electronic device.

BACKGROUND ART

Printed wiring boards such as a flexible printed circuitry (hereinafter abbreviated as FPC) have been used in small portable electronic devices such as smartphones and tablet PCs for reasons of the ease of wiring and the lightweight properties that the printed wiring boards have. For such FPCs, two-layered flexible boards that are formed by laminating a copper foil on a polyimide-base resin board and integrating them with an adhesive agent or thermocompression are used. Another type of two-layered flexible boards that are formed by forming a resin layer of polyimide resin as an example on a copper foil is also used. The method of forming the resin layer is not specifically limited. However, a polyimide-base resin layer can be formed by applying a mixture containing polyamic acid obtained from addition polymerization of aromatic diamines and aromatic dianhydride in a solution state to a copper foil, drying the applied mixture, forming a polyamic acid layer as a polyimide precursor layer, imidizing the polyamic acid layer by heating the layer to 300-400° C. under an inert atmosphere of nitrogen etc.

Conventionally, a subtractive method has been used to form a desired wiring pattern on an FPC. In the subtractive method, a resist layer is provided on a place to be wiring on a copper foil that is adhered to an insulating resin layer of the two-layered flexible board. The resist layer is exposed to light and partially removed by development, and a copper foil layer exposed from the removed portion is removed by etching with a solution such as a copper chloride solution and a ferric chloride solution. Finally, by peeling and removing the resist layer, a wiring board can be formed. When a wiring pattern is formed with this subtractive method, a cross section of the wiring portion tends to have a trapezoidal shape that spreads toward the bottom. In order to obtain electrical insulation properties, a sufficient width of wiring/space needs to be obtained, and for that reason, there have been limitations to fine-pitch wiring patterns with this method.

Meanwhile, as a method to achieve fine-pitch wiring such as wiring/space (L/S)=20/20 μm or 15/15 μm, which is considered to be difficult with the subtractive method, a semi-additive method has been proposed. In the semi-additive method, a resist layer is provided on a copper foil adhered to an insulating resin layer of the above two-layered flexible board. Next, the resist layer is exposed to light and developed so that the resist on a portion in which a circuit is formed is peeled and removed, and copper plating is performed on the copper foil layer that is exposed from the removed portion. After obtaining a desired thickness of copper layer by the copper plating, the remaining resist layer is peeled and removed, and the shape of the circuit is formed. Next, a copper foil present in a bottom portion between circuits is dissolved and removed by flash etching etc., and a wiring board can be formed.

In recent years, with further reduction in weight, size and thickness of electronic devices, demands on more highly dense wiring have been increasing, and the fine-pitch wiring technique that uses the semi-additive method has becomes increasingly important. In addition, the fine-pitch wiring is also required to have high bending endurance that had been required in flexible wiring boards.

For example, Patent Literature 1 proposes that among electrolytic plating layers, at least one copper sputter layer is provided as an intermediate layer, and as a result, an occurrence of micro-cracking and an occurrence of through-cracking is prevented and characteristics of sliding bends has been significantly improved. Patent Literature 2 proposes that a copper-plated layer has a multilayer structure and a twin particle diameter is less than 5 μm and has good bending endurance tested by MIT.

CITATION LIST

Patent Literature

[Patent Literature 1] Japanese Patent Laid-Open Application No. 2006-278950
Patent Literature 2: Japanese Patent Laid-Open Application No. 2011-014848

SUMMARY OF INVENTION

Technical Problem

However, both the printed wiring board in Patent Literature 1 and the printed wiring board in Patent Literature 2 had a problem of having poor bending endurance against harsher demands such as 180° bending.

In view of the above problem, the present invention provide a laminate for printed wiring board that is a laminate used in a method of manufacturing printed wiring boards that includes a process of forming a circuit by any one of a semi-additive method, a partly additive method, a modified semi-additive method, and an embedding method, and the laminate has favorable bending endurance and circuit formability.

As a result of thorough study, the inventors of the present invention found that in a laminate used in a method of manufacturing printed wiring boards that includes a process of forming a circuit by any one of a semi-additive method, a partly additive method, a modified semi-additive method, and an embedding method, by providing the laminate with an insulting resin substrate, a metal layer 1 and a metal layer 2 in this order and by focusing on and controlling the crystal orientation of the metal layer 1 and the metal layer 2 of the laminate, favorable bending endurance and circuit formability are obtained from the laminate for printed wiring board.

The present invention was made on the basis of the above finding, and one aspect of the present invention is a laminate for printed circuit board in which the laminate is used in a printed circuit board manufacturing method that includes a step of forming a circuit by any one of a semi-additive method, a partly additive method, a modified semi-additive method, and an embedding method, and the laminate includes an insulating resin substrate, a metal layer 1 and a metal layer 2 in this order, and when a cross section parallel to a thickness direction of the laminate is processed by means of ion milling and the cross section of the metal layer 1 and the metal layer 2 is observed with EBSD, in the cross section, each of the metal layer 1 and the metal layer 2 has one or plural crystal grains, and an area ratio of a total area of at least one crystal grain of which a difference in angle of a <100> crystal direction from a perpendicular of the cross section is 15° or less from among the one or plural crystal grains of the metal layer 1 and the one or plural crystal grains of the metal layer 2 to a total area of the one or plural crystal grains in the metal layer 1 and the one or plurality of crystal grains in the metal layer 2 is 15% or higher and less than 97%.

In another embodiment of the laminate for printed circuit board according to the present invention, when the cross section parallel to the thickness direction of the laminate is processed by means of ion milling and the cross section of the metal layer 1 is observed with EBSD, in the cross section, the metal layer 1 has one or plural crystal grains, an area ratio of an area of at least one crystal grain of which a difference in angle of a <100> crystal direction from a perpendicular of the cross section is 15° or less from among the one or plural crystal grains in the metal layer 1 to a total area of the one or plural crystal grains in the metal layer 1 is 40% or higher.

In another embodiment of the laminate for printed circuit board according to the present invention, the area ratio of the total area of the at least one crystal grain of which the difference in angle of the <100> crystal direction from the perpendicular of the processed cross section is 15° or less from among the one or plural crystal grains in the metal layer 1 and the one or plural crystal grains in the metal layer 2 to the total area of the one or plural crystal grains in the metal layer 1 and the one or plural crystal grains in the metal layer 2 is 90% or less.

In another embodiment of the laminate for printed circuit board according to the present invention,
the area ratio of the total area of the at least one crystal grain of which the difference in angle of the <100> crystal direction from the perpendicular of the processed cross section is 15° or less from among the one or plural crystal grains in the metal layer 1 and the one or plural crystal grains in the metal layer 2 to the total area of the one or plural crystal grains in the metal layer 1 and the one or plural crystal grains in the metal layer 2 is 18% or higher.

In another embodiment of the laminate for printed wiring board according to the present invention, when the cross section parallel to the thickness direction of the laminate is processed by means of ion milling and the cross section of the metal layer 1 and the metal layer 2 is observed, a thickness of the metal layer 2 is the same as or thicker than a thickness of the metal layer 1.

In another embodiment of the laminate for printed wiring board according to the present invention, when the cross section parallel to the thickness direction of the laminate is processed by means of ion milling and the cross section of the metal layer 1 and the metal layer 2 is observed, a thickness of the metal layer 2 is 1.1 times or more thicker than a thickness of the metal layer 1.

In another embodiment of the laminate for printed wiring board according to the present invention, when the cross section parallel to the thickness direction of the laminate is processed by means of ion milling and the cross section of the metal layer 1 and the metal layer 2 is observed, a thickness of the metal layer 2 is 1.3 times or more thicker than a thickness of the metal layer 1.

In another embodiment of the laminate for printed wiring board according to the present invention, the metal layer 1 is a rolled copper foil.

In another embodiment of the laminate for printed wiring board according to the present invention, the cross section parallel to the thickness direction of the laminate is a cross section parallel to the thickness direction of the laminate and parallel to a rolling direction when the metal layer 1 is a rolled copper foil, or is a cross section parallel to the thickness direction of the laminate and parallel to an MD direction when the metal layer 1 is an electrolytic copper foil.

In another embodiment of the laminate for printed wiring board according to the present invention, the laminate for printed wiring board is bent for use, and the cross section parallel to the thickness direction of the laminate is parallel to the thickness direction of the laminate and when the laminate for printed wiring board is bent for use, the cross section corresponds to a cross section perpendicular to a direction to which an bending axis extends.

In another embodiment of the laminate for printed wiring board according to the present invention, the laminate comprises a circuit or wiring, and when the cross section parallel to the thickness direction of the circuit or wiring is processed by means of ion milling and the cross section is observed with EBSD, in the cross section, the circuit or wiring has a plural crystal grains, and an area ratio of a total area of at least one crystal grain of which a difference in angle of a <100> crystal direction from a perpendicular of the cross section from among the plural crystal grains in the circuit or wiring is 15° or less to a total area of the plural crystal grains in the circuit or wiring is 15% or higher and less than 97%.

In another embodiment of the laminate for printed wiring board according to the present invention, the cross section parallel to the thickness direction of the circuit or wiring is a cross section parallel to the thickness direction of the circuit or wiring and parallel to a direction to which the circuit or wiring extends, or is a cross section parallel to the thickness direction of the circuit or wiring and parallel to a width direction of the circuit or wiring.

In another embodiment of the laminate for printed wiring board according to the present invention, the laminate for printed wiring board is bent for use, and the cross section parallel to the thickness direction of the circuit or wiring is parallel to the thickness direction of the circuit or wiring and when the laminate for printed wiring board is bent for use, the cross section corresponds to a cross section perpendicular to a direction to which an bending axis extends.

In another aspect, the present invention is a method of manufacturing a printed circuit board by using the laminate for printed circuit board.

In another aspect, the present invention is a method of manufacturing an electronic device by using the laminate for printed circuit board or the printed circuit board manufactured by means of the method of the present invention.

Advantageous Effect of Invention

It is possible to provide a laminate for printed wiring board that is a laminate used in a method of manufacturing printed wiring boards that includes a process of forming a circuit by any one of a semi-additive method, a partly additive method, a modified semi-additive method, and an embedding method, and the laminate has favorable bending endurance and circuit formability.

BRIEF DESCRIPTION OF DRAWINGS

FIG. 1 is an explanatory diagram of 180° bending test according to Examples.

DESCRIPTION OF EMBODIMENTS (Laminate for Printed Wiring Board)

A laminate for printed wiring board according to the present invention is a laminate used in a method of manufacturing printed wiring boards that includes a process of forming a circuit by any one of a semi-additive method, a partly additive method, a modified semi-additive method, and an embedding method. Details of the semi-additive method, the partly additive method, the modified semi-additive method and an embedding method to form a circuit on the laminate for printed wiring board according to the present invention are described later.

The laminate for printed wiring board according to the present invention has an insulating resin substrate, a metal layer 1 and a metal layer 2 in this order.

The insulating resin substrate may be made of paper-substrate phenolic resin, paper-substrate epoxy resin, synthetic fabric-substrate epoxy resin, glass fabric/paper composite substrate epoxy resin, glass fabric/glass non-woven fabric composite substrate epoxy resin and glass fabric substrate epoxy resin, polyimide resin, liquid crystal polymer (LCP), fluorine resin, polyethylene terephthalate (PET) resin, polypropylene (PP) resin, polyamide resin, polyimideamide resin, cycloolefin polymer and the like. The insulating resin substrate may be a prepreg, or may include thermosetting resin. The insulating resin substrate may also be a thin flexible film. The insulating resin substrate may have any thickness. The thickness of the insulating resin substrate is typically 1-1000 µm, 5-500 µm, 10-300 µm, 12-200 µm, 15-100 µm, or 75 µm. Note that for the insulating resin substrate, a thin flexible film-type rein substrate is particularly preferable because a favorable bending endurance can be obtained when such a resin substrate is used.

For the metal layer 1, a metallic foil (a rolled metallic foil or an electrolytic metallic foil), a copper foil, an aluminum foil, a nickel foil, a copper alloy foil, a nickel alloy foil, an aluminum alloy foil, a stainless foil, an iron foil, an iron alloy foil and the others may be used. In addition, for the metal layer 1, an electrolytic copper foil or a rolled copper foil can be used, and in particular, the use of a rolled copper foil is preferable because a rolled copper foil has favorable workability to realize the bending endurance of the present invention.

In general, an electrolytic copper foil is manufactured by performing copper sulfate plating bath and electrolytic deposition of copper on a titanium or stainless drum, and a rolled copper foil is manufactured by repeating plastic working of a mill roll and heat treatment. The raw materials of the copper foil include a highly pure copper such as a tough pitch copper (JIS H3100: alloy number C1100), an oxygen-free copper (JIS H3100: alloy number C1020 or JIS H3510; alloy number C1011), a copper phosphate (JIS H3100: alloy number C1201, C1220, or C1221) and an electrolytic copper as an example, and a copper containing Sn, a copper containing Ag, a Zr or Mg-added copper alloy or a copper alloy such as a Ni and Si-added Corson copper alloy can also be used. Note that when the term "copper foil" is used alone in this specification, the term includes a copper alloy foil. The raw materials of the copper foil can be a rolled copper foil containing one or more selected from a group of P, B, Ti, Mn, V, Cr, Mo, Ag, Sn, In, Au, Pd, Zn, Ni, Si, Zr, and Mg in total of 30-300 wt ppm, a copper foil, a tough-pitch copper foil, an oxygen-free copper foil or a phosphorous deoxidized copper foil. The thickness of the metal layer 1 is not limited, but can be 1-150 µm as an example. The thickness of the metal layer 1 may be 1.5-110 µm, 2-105 µm, 2.5-90 µm, 3-85 µm, 3.5-80 µm, 4-70 µm, 4.5-35 µm, or 5-35 µm. Note that regarding the thickness of the metal layer 1, a thinner layer is more preferable because a thinner layer increases productivity of printed wiring boards. Also note that when the laminate for printed wiring board according to the present invention is used in the embedding method, the metal layer 1 can be formed by means of non-electrolytic Cu plating and/or electrolytic Cu plating.

The metal layer 2 can be formed by means of non-electrolytic Cu plating and/or electrolytic Cu plating. The thickness of the metal layer 2 is not limited, but 1-150 µm as an example. The thickness of the metal layer 2 may be 2-110 µm, 3-105 µm, 4-90 µm, 5-85 µm, 6-80 µm, 9-70 µm, 12-35 µm, or 18-35 µm. Note that when a circuit is formed by any one of a semi-additive method, a partly additive method, a modified semi-additive method, and an embedding method, a thinner layer is preferable in regard to the thickness of the metal layer 2. Also note that when the laminate for printed wiring board according to the present invention is used in the embedding method, the copper foil, the aluminum foil, the nickel foil, the copper alloy foil, the nickel alloy foil, the aluminum alloy foil, the stainless foil, the iron foil, the iron alloy foil and the others that are described above may be used for the metal layer 2.

Regarding the metal layer 1 that is laminated on the resin substrate, a metal layer with a high area ratio is preferable. Here, the area ratio is the area ratio of a total area of crystal grains of which a difference in angle of the <100> crystal direction of crystal grains on the cross section of the metal layer 1 from a perpendicular of a cross section parallel to the thickness direction of the laminate is 15° or less to the crystal grains on the cross section of the metal layer 1 (in other words, when a cross section parallel to a thickness direction of the laminate is processed by means of ion milling and the cross section of the metal layer 1 is observed with EBSD, in the cross section, the metal layer 1 has one or plural crystal grains, and an area ratio of a total area of at least one crystal grain of which a difference in angle of a <100> crystal direction from a perpendicular of the cross section is 15° or less from among the one or plural crystal grains of the metal layer 1 to the total area of the one or plural crystal grains). The metal layer 1 with the high area ratio is preferable because such a metal layer allows the metal layer 2 that is laminated on the metal layer 1 to have a higher area ratio of the total area of crystal grains of which a difference in angle of the <100> crystal direction of crystal grains on a cross section of the metal layer 1 parallel to the thickness direction of the laminate from a perpendicular of the cross section is 15° or less to the total area of the crystal grains on the cross section of the metal layer 2. In addition, it is preferable to have the metal layer 1 laminated on the resin substrate reduce the thickness by means of half etching with a chemical polishing solution because unnecessary portions of the metal layer 1 can be readily removed by means of flash etching etc., resulting in improved microcircuits formability and increased productivity of printed wiring boards.

The current density to form the above-described metal layer 2 by means of electrolytic plating is set to be a low current density, e.g., 0.1-1.0 A/dm². A high current density (e.g., 10 A/dm²) is not preferable because it would be difficult to have a high area ratio of the total area of crystal grains of which the difference in angle of the [100] direction on the cross section of the metal layer 2 from a perpendicular of the cross section parallel to the thickness direction of the laminate is 15° or less in the metal layer 2. Moreover, in order to relax plating strains of the metal layer 2, it is preferable to perform heat treatment after laminating the metal layer 2. In the electrolytic Cu plating of the metal layer 2, it is preferable to adjust conditions of the concentration of additives (organic additives, chloride, etc.). In addition, the temperature of the electrolytic Cu plating of the metal layer 2 is preferable a room temperature. Note that the use of a rolled copper foil is preferable for the above-described metal layer 1. Note that at the time of measuring the above-described area ratio, a cross section parallel to the thickness direction of the laminate is preferably a cross section parallel to the rolling direction or a cross section parallel to the MD direction. The laminate for printed wiring board according to the present invention is preferably bent for use. In addition, at the time of measuring the above-described area ratio, the cross section parallel to the thickness direction of the laminate is preferably a cross section perpendicular to a direction to which a bending axis at the time of bending extends. This is because, in the above-described cross section, by controlling the area ratio to be within a range described layer, the bending endurance can be more preferably improved.

The laminate for printed wiring board according to the present invention is controlled so as to satisfy the following conditions. When a cross section parallel to a thickness direction of the laminate is processed by means of ion milling and the cross section of the metal layer 1 and the metal layer 2 is observed with EBSD, in the cross section, each of the metal layer 1 and the metal layer 2 has one or plural crystal grains, and an area ratio of a total area of at least one crystal grain of which a difference in angle of a <100> crystal direction from a perpendicular of the cross section is 15° or less from among the one or plural crystal grains of the metal layer 1 and the one or plural crystal grains of the metal layer 2 to the total area of the one or plural crystal grains of the metal layer 1 and the one or plural crystal grains of the metal layer 2 (in other words, the metal layer 1 and the metal layer 2 are regarded as one layer to calculate the total area of the one or plural crystal grains of the metal layer 1 and the one or plural crystal grains of the metal layer 2) is 15% or higher and less than 97%. When this area ratio of the metal layer 1 and the metal layer 2 is 15% or higher, an improved bending endurance can be obtained. When this combined area ratio of the metal layer 1 and the metal layer 2 is less than 97%, circuit formability of the laminate for printed wiring board is improved. Further detailed explanations are provided below.

The metal layer 1 and the metal layer 2 (e.g., copper foils and rolled copper foils) that have a high area ratio of the total area of crystal grains of which a difference in angle of the <100> crystal direction of a cross section of the metal layer 1 and the metal layer 2 parallel to the thickness direction of the laminate from a perpendicular of the cross section is 15° or less (such crystal grains are hereinafter referred to as "crystal grain A") to the total area of the crystal grains on the cross section of the metal layer 1 and the metal layer 2 are likely to have favorable bending endurance. Note that "the crystal grains on the cross section" in the above description refers to both one or plural crystal grains in the metal layer 1 and one or plural crystal grains in the metal layer 2 when each of the metal layer 1 and the metal layer 2 has one or plural crystal grains on the above cross section. This is because strains caused by a bending motion (bending fatigue) will not be readily accumulated in the above-described crystal grain(s) A and the strains will be relaxed while being propagated from within the metal layer 1 and the metal layer 2 to the surface of the metal layer 1 and the metal layer 2.

Meanwhile, in an electrolytic copper foil, or when the metal layer 1 and the metal layer 2 (a Cu layer) is formed by means of non-electrolytic Cu plating or electrolytic Cu plating, crystal grains oriented in the <100> crystal direction (i.e., crystal grains A) are not dominantly formed, but in most cases, many of crystal grains have the {111} surface oriented in parallel to the surface of the laminate or crystal grains are oriented in random directions. In such a case, strains caused by a bending motion (bending fatigue) are easily accumulated in the metal layer 1 and the metal layer 2 (Cu layer) with crystal grains having the {111} surface oriented in parallel to the surface of the laminate or randomly oriented crystal grains, causing cracks at crystal grain boundaries. As a result, such copper foils have poor bending endurance.

In the case of the metal layer 1 having crystal grains highly oriented in the <100> crystal direction (i.e., the area ratio of the total area of the crystal grains A in the metal layer 1 to the total area of the crystal grains on the cross section in metal layer 1 is high), when the metal layer 2 is formed on the metal layer 1 by means of electrolytic Cu plating, the crystal grains of the electrolytic Cu plated layer in the metal layer 2 are affected by the crystal orientation of the metal layer 1 and a part or all of the crystal grains grow so as to have the same crystal orientation, which is so-called epitaxial growth. Note that "crystal grains on the cross section" described above refers to one or plural crystal grains in the metal layer 1 when the metal layer 1 has one or plural crystal grains on the above-described cross section. As a result of this epitaxial growth, the metal layer 2 is also likely to have a high area ratio of the total area of crystal grains of which a difference in angle of the <100> crystal direction of crystal grains on a cross section of the metal layer 2 parallel to the thickness direction of the laminate from a perpendicular of the cross section is 15° or less to the total area of the crystal grains on the cross section of the metal layer 2. Note that the above "crystal grains on the cross section" refers to one or plural crystal grains in the metal layer 2 when the metal layer 2 has one or plural crystal grains on the above-described cross section. Therefore, when the area ratio of the total area of the crystal grain(s) of which a difference in angle of the <100> crystal direction from a perpendicular of the processed cross section is 15° or less with respect to the total area of the crystal grains in both the metal layer 1 and metal layer 2 (i.e., the metal layer 1 and the metal layer 2 are regarded as one layer) is kept at 15% or higher but less than 97%, strains caused by bending motions are not readily accumulated and consequently cracks are not readily caused by the bending motions, and as a result, good bending endurance can be obtained in the whole laminate.

In order to control the area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1, the following is one of the methods.

When the metal layer 1 is a metal foil formed by means of rolling (a rolled metal foil), the area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1 can be controlled by controlling the surface roughness of mill rolls used in the final cold rolling. When a value of surface roughness measurements of the mill rolls is small (e.g., arithmetic average roughness Ra (JIS B0601 1994) is 0.05 µm or less), the area ratio of the total area of crystal grain(s) of which a difference in angle of the <100> crystal direction of the crystal grain(s) on a cross section of the metal layer 1 parallel to the thickness direction of the laminate from a perpendicular of the cross section parallel to the thickness direction of the laminate is 15° or less with respect to the total area of the crystal grains on the cross section in the metal layer 1 can be a high value. When a value of surface roughness measurements of the mill rolls is large (e.g., arithmetic average roughness Ra (JIS B0601 1994) is 0.15 µm or greater), the area ratio of the total area of crystal grain(s) of which a difference in angle of the <100> crystal direction of the crystal grain(s) on the cross section of the metal layer 1 parallel to the thickness direction of the laminate from a perpendicular of the cross section is 15° or less with respect to the total area of the crystal grains on the cross section in the metal layer 1 can be a low value. The causes of this difference in area ratio are presumed to be the following. When mill rolls with a large value of surface roughness measurements are used in the final cold rolling, oil pits are formed on the surface of the copper foil, and as the processing proceeds, shear deformation bands are readily formed at the edges of the oil pits, but by rolling with mill rolls with a small value of surface roughness measurements in the final cold rolling, the shape and frequency of the oil pits are changed so that the shear deformation bands are not likely to develop.

Note that the degree of processing in the final cold rolling is preferably 98% or higher and more preferably 99% or higher. As a result of making the degree of processing in the final cold rolling be 98% or higher, it is possible to obtain an increased area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1.

When the metal layer 1 is a metal foil formed by means of electroplating (an electrolytic metal foil), the area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1 can be controlled by adding the following additives to the electrolyte solution used at the time of forming the metal layer 1. By increasing the concentration of the additives, it is possible to obtain a higher ratio of the area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1. By decreasing the concentration of the additives, it is possible to obtain a lower ratio of the area ratio of the total area of crystal grain(s) of which a difference in angle of the <100> crystal direction of the crystal grain(s) on a cross section of the metal layer 1 parallel to the thickness direction of the laminate from a perpendicular of the cross section is 15° or less with respect to the total area of the crystal grains on the cross section in the metal layer 1.

Additives
Gelatin: 1-5 mg/L
Sodium 3-mercaptopropanesulphonate (MPS): 1-10 mg/L
Chloride ion: 15-50 mg/L
Thiourea: 0.1-2.5 mg/L In the case of an electrolyte solution for copper plating, as an example, the following electrolyte solution and electrolysis conditions can be adopted.
Copper sulfate (expressed in terms of copper): 50-100 g/L
Sulfuric acid: 90-130 g/L
Gelatin: 1-5 mg/L
Sodium 3-mercaptopropanesulphonate (MPS): 1-10 mg/L
Chloride ion: 15-50 mg/L
Thiourea: 0.1-2.5 mg/L
Temperature of the solution: 30-80° C.
Current density: 20-120 A/dm$^2$ In a case that both the metal layer 1 and the metal layer 2 are regarded as one layer, when the area ratio of the total area of crystal grain(s) of which a difference in angle of the <100> crystal direction of the crystal grain(s) on a cross section of the metal layer 1 and the metal layer 2 parallel to the thickness direction of the laminate from a perpendicular of the cross section is 15° or less with respect to the total area of the crystal grains on the cross section in both the metal layer 1 and the metal layer 2, is less than 15%, the metal layers 1 and 2 are likely to have crystal grains highly oriented in random directions and are therefore likely to have poor bending endurance because strains are accumulated at crystal grain boundaries and cracks are generated in response to bending motions. Note that "crystal grains on the cross section" refers to both the one or plural crystal grains in the metal layer 1 and the one or plural crystal grains in the metal layer 2 when each of the metal layer 1 and the metal layer 2 has one or plural crystal grains on the above-described cross section.

Note that the laminate for printed wiring board according to the present invention may have another layer(s) (e.g., a non-electrolytic copper plated layer, or a non-electrolytic copper plated layer and an electrolytic copper plated layer) between the metal layer 1 and the metal layer 2. Even when another layer(s) is provided between the metal layer 1 and the metal layer 2, the area ratio of the total area of crystal grain(s) of which a difference in angle of the <100> crystal direction of the crystal grain(s) on a cross section of the metal layer 1 and the metal layer 2 parallel to the thickness direction of the laminate from a perpendicular of the cross section is 15° or less with respect to the crystal grains on the cross section in the metal layer 1 and the metal layer 2" defined in the present invention refers to an area ratio of the total area of the metal layer 1, another layer(s), and the metal layer 2 ("an area ratio of the total area of the metal layer 1, another layer(s), and the metal layer 2" means that the metal layer 1, another layer(s) and the metal layer 2 are regarded as one layer to calculate the total area. Therefore "an area ratio of the total area of the metal layer 1, another layer(s), and the metal layer 2" refers to "an area ratio of crystal grain(s) of which a difference in angle of the <100> crystal direction of the crystal grain(s) on a cross section of the metal layer 1, another layer(s) and the metal layer 2 parallel to the thickness direction of the laminate from a perpendicular of the cross section and is 15° or less with respect to the total area of the crystal grains on the cross section in the metal layer 1, another layer(s) and the metal layer 2"). Note that "the crystal grains on the cross section" in the above description refers to one or plural crystal grains in the metal layer 1, one or plural crystal grains in another layer(s) and one or plural crystal grains in the metal layer 2 when each of the metal layer 1, another layer(s) and the metal layer 2 has one or plural crystal grains on the above cross section.

In the laminate for printed wiring board according to the present invention, when a cross section parallel to a thickness direction of the laminate is processed by means of ion milling and the processed cross section of the metal layer 1 and the metal layer 2 is observed with EBSD, in the processed cross section, each of the metal layer 1 and the metal layer 2 has one or plural crystal grains, and an area ratio of a total area of at least one crystal grain of which a difference in angle of a <100> crystal direction from a perpendicular of the processed cross section is 15° or less from among the one or plural crystal grains of the metal layer 1 and the one or plural crystal grains of the metal layer 2 to the total area of the one or plural crystal grains of the metal layer 1 and the one or plural crystal grains of the metal layer 2 is preferably 15.1% or higher, more preferably 18% or higher, more preferably 20% or higher, furthermore preferably 25% or higher, furthermore preferably 27% or higher, furthermore preferably 29% or higher, furthermore preferably 31% or higher, and furthermore preferably 33% or higher, and is preferably 96% or less, more preferably 90% or less, more preferably 85% or less, and more preferably 80% or less in the combined layers of the metal layer 1 and the metal layer 2.

In the laminate for printed wiring board according to the present invention, when across section that is parallel to the thickness direction of the laminate is processed by means of ion milling and the processed cross sections of the metal layer 1 are observed with EBSD, in the processed cross section, the metal layer 1 has one or plural crystal grains, and an area ratio of a total area of at least one crystal grain of which a difference in angle of a <100> crystal direction from a perpendicular of the cross section is 15° or less from among the one or plural crystal grains of the metal layer 1 to the total area of the one or plural crystal grains is preferably 40% or higher. This structure is advantageous because the structure enhances bending endurance.

In addition, in the laminate for printed wiring board according to the present invention, when a cross section parallel to a thickness direction of the laminate is processed by means of ion milling and the processed cross section of the metal layer 1 2 is observed with EBSD, in the processed cross section, the metal layer 1 has one or plural crystal grains, and an area ratio of a total area of at least one crystal grain of which a difference in angle of a <100> crystal direction from a perpendicular of the processed cross section is 15° or less from among the one or plural crystal grains of the metal layer 1 to the total area of the one or plural crystal grains of the metal layer 1 is more preferably 60% or higher, furthermore preferably 65% or higher, furthermore preferably 70% or higher, furthermore preferably 80% or higher, and furthermore preferably 90% or higher. Moreover, when a cross section that is parallel to the thickness direction of the laminate is processed by means of ion milling and the processed cross section of the above-described metal layer 1 is observed with EBSD, the upper limit of the area ratio of the total area of the crystal grain(s) of which a difference in angle of the <100> crystal direction of the crystal grain(s) from a perpendicular of the processed cross section is 15° or less with respect to the total area of the one or plural crystal grains of the metal layer 1 does not need to be limited, but is typically 100% or less, 99.9% or less, 99.5% or less, 99.0% or less, 98.5% or less, or 98.0% or less, as an example.

In the laminate for printed wiring board according to the present invention, when across section that is parallel to the thickness direction of the laminate is processed by means of ion milling and the processed cross sections of the above-described metal layer 1 and the above-described metal layer 2 are observed, the thickness of the above-described metal layer 2 is preferably the same as or thicker than the thickness of the above-described metal layer 1. This structure provides improved circuit formability.

Furthermore, in the laminate for printed wiring board according to the present invention, when a cross section that is parallel to the thickness direction of the laminate is processed by means of ion milling and the processed cross sections of the above-described metal layer 1 and the above-described metal layer 2 are observed, the thickness of the above-described metal layer 2 is more preferably 1.1 times or more than 1.1 times thicker than the thickness of the above-described metal layer 1, more preferably 1.2 times or more than 1.2 times thicker than the thickness of the above-described metal layer 1, more preferably 1.3 times or more than 1.3 times thicker than the thickness of the above-described metal layer 1, more preferably 1.4 times or more than 1.4 times thicker than the thickness of the above-described metal layer 1, furthermore preferably 1.5 times or more than 1.5 times thicker than the thickness of the above-described metal layer 1, and furthermore preferably twice or more than twice thicker than the thickness of the above-described metal layer 1. The upper limit of the thickness of the metal layer 2 does not need to be limited, but is typically 20 times or less than 20 times thicker than the thickness of the metal layer 1, 15 times or less than 15 times thicker than the thickness of the metal layer 1, or 10 times or less than 10 times thicker than the thickness of the metal layer 1.

The laminate for printed wiring board according to the present invention is particularly suitable when the laminate is bent for use. The cross section parallel to the thickness direction of the laminate to measure the area ratio is preferably a cross section parallel to the rolling direction or a cross section parallel to the MD direction. The cross section parallel to the thickness direction of the laminate to measure the area ratio is preferably a cross section in a direction perpendicular to a direction to which a bending axis extends when the laminate is bent. This is because, with the cross section described above, it is possible to more favorably improve the bending resistance by controlling the area ratio within the above-described range.

The laminate for printed wiring board according to the present invention has circuits or wiring, and when a cross section parallel to the thickness direction of the circuit or wiring is processed by means of ion milling and the processed cross section is observed with EBSD, in the processed cross section, the circuit or wiring has plural crystal grains, and an area ratio of a total area of at least one crystal grain of which a difference in angle of a <100> crystal direction from a perpendicular of the cross section from among the plural crystal grains in the circuit or wiring is 15° or less to a total area of the plural crystal grains in the circuit or wiring is preferably 15% or higher and less than 97%. When the area ratio is 15% or higher, an improved bending endurance can be obtained in the laminate for printed wiring board. When this area ratio is less than 97%, circuit formability of the laminate for printed wiring board is improved.

In addition, the laminate for printed wiring board according to the present invention has circuits or wiring, and when a cross section parallel to the thickness direction of the circuit or wiring is processed by means of ion milling and the processed cross section is observed with EBSD, in the processed cross section, the circuit or wiring has plural crystal grains, and an area ratio of a total area of at least one crystal grain of which a difference in angle of a <100> crystal direction from a perpendicular of the cross section from among the plural crystal grains in the circuit or wiring is 15° or less to a total area of the plural crystal grains in the circuit or wiring is preferably 15.1% or higher, more preferably 18% or higher, more preferably 20% or higher, furthermore preferably 25% or higher, furthermore preferably 27% or higher, furthermore preferably 29% or higher, furthermore preferably 31% or higher, furthermore preferably 33% or higher, and is preferably 96% or less, more preferably 90% or less, more preferably 85% or less, and more preferably 80% or less.

At the time of measuring the above-described area ratio, the cross section parallel to the thickness direction of the circuit or wiring is preferably a cross section parallel to a direction that the circuit or wiring extends, or a cross section parallel to a width direction of the circuit or wiring. In addition, at the time of measuring the above-described area ratio, the cross section parallel to the thickness direction of the circuit or wiring is a cross section perpendicular to a direction that a bending axis extends when the circuit or wiring is bent. This is because, with the cross section described above, it is possible to more favorably improve the bending resistance by controlling the area ratio within the above-described range.

(Surface Treated Layer)

The laminate for printed wiring board according to the present invention may be provided with one or more layer(s) selected from a group of a roughened layer, a heat-resistant layer, a rustproofing layer, a chromate treated layer, and a silane coupling-treated layer on one or both of a surface of the metal layer 1 on the insulating resin substrate side and the surface of the metal layer 2. Another layer(s) described above may be one or more layer(s) selected from a group of a roughened layer, a heat-resistant layer, a rustproofing layer, a chromate treated layer, and a silane coupling-treated layer.

Providing a roughened layer is advantageous because when the metal layer 1 is laminated on the insulating resin substrate, or when a resin layer such as a permanent resist is provided on the laminate on the metal layer 2 side, adhesion strength is increased between the metal layer 1 and the insulating resin substrate or between the laminate and the resin layer and the metal layer 1 and the insulating resin substrate or the laminate and the resin layer are not readily separated. The roughened layer may be provided by using a method known in the art. A roughening treatment can be conducted by forming roughening particles of copper or copper alloy as an example. In light of fine pitch formation, the roughened layer is preferably made of very fine particles. Regarding the electroplating conditions at the time of forming roughening particles, particles tend to be finer with a higher current density, lower copper concentration in the plating solution, or a larger amount of coulomb. The roughened layer may be a layer of any one or an alloy including at least one selected from a group consisting of copper, nickel, cobalt, phosphorus, tungsten, arsenic, molybdenum, chromium, and zinc. After forming roughening particles of copper or copper alloy, further roughening treatment can be conducted to provide secondary particles or tertiary particles of any one or an alloy of nickel, cobalt, copper, and zinc. Afterwards, the heat-resistant layer or the rustproofing layer of any one or an alloy of nickel, cobalt, copper, and zinc may be formed, and furthermore, the chromate treated layer and the silane coupling-treated layer may be provided by conducting chromate treatment or silane coupling treatment on the outermost surface. Note that each of the above-described heat-resistant layer, rustproofing layer, chromate treated layer, and silane coupling-treated layer may be formed of plural layers (e.g., two layers or more, three layer or more)

For the heat-resistant layer and the rustproof layer, a heat-resistant layer known in the art and a rustproof layer known in the art may be used. For example, the heat-resistant layer and/or the rustproofing layer may be a layer containing at least one element selected from a group of nickel, zinc, tin, cobalt, molybdenum, copper, tungsten, phosphorous, arsenic, chromium, vanadium, titanium, aluminum, gold, silver, platinum group elements, iron, and tantalum, or a metal or an alloy layer of at least one element selected from a group of nickel, zinc, tin, cobalt, molybdenum, copper, tungsten, phosphorous, arsenic, chromium, vanadium, titanium, aluminum, gold, silver, platinum group elements, iron, and tantalum. In addition, the heat-resistant layer and/or the rustproofing layer may contain an oxide, a nitride, or a silicide containing at least one element selected from a group of nickel, zinc, tin, cobalt, molybdenum, copper, tungsten, phosphorous, arsenic, chromium, vanadium, titanium, aluminum, gold, silver, platinum group elements, iron, and tantalum. Moreover, the heat-resistant layer and/or the rustproofing layer may also be a layer containing a nickel-zinc alloy. Alternatively, the heat-resistant layer and/or the rustproofing layer may be a nickel-zinc alloy layer. This nickel-zinc alloy may contain, besides inevitable impurities, 50 wt %-99 wt % nickel and 50 wt %-1 wt % zinc. The total deposition amount of zinc and nickel in the nickel-zinc alloy layer may be 5-1000 mg/m$^2$, preferably 10-500 mg/m$^2$, or preferably 20-100 mg/m$^2$. In the nickel-zinc alloy layer or the layer containing a nickel-zinc alloy, the ratio of the deposition amount of nickel to the deposition amount of zinc (=the deposition amount of nickel/the deposition amount of zinc) is preferably 1.5-10. The deposition amount of nickel in the layer containing the nickel-zinc alloy or the nickel-zinc alloy layer is preferably 0.5 mg/m$^2$-500 mg/m$^2$, or more preferably 1 mg/m$^2$-50 mg/m$^2$.

The heat-resistant layer and/or the rustproofing layer may be a laminate of a nickel layer or a nickel alloy layer with its deposition amount of 1 mg/m$^2$-100 mg/m$^2$, preferably 5 mg/m$^2$-50 mg/m$^2$ and a tin layer with its deposition amount of 1 mg/m$^2$-80 mg/m$^2$, preferably 5 mg/m$^2$-40 mg/m$^2$ laminated in this order, and the nickel alloy layer may be any one of nickel-molybdenum, nickel-zinc, and nickel-molybdenum-cobalt. In the heat-resistant layer and/or the rustproofing layer, the total deposition amount of nickel, nickel alloy and tin is preferably mg/m$^2$-150 mg/m$^2$, more preferably 10 mg/m$^2$-70 mg/m$^2$. Additionally, in the heat-resistance layer and/or the rustproofing layer, [nickel deposition amount in nickel or nickel alloy]/[tin deposition amount]=0.25-10 is preferable and 0.33-3 is more preferable. Here, the chromate treated layer refers to a layer treated with a liquid including chromic acid anhydride, chromic acid, dichromic acid, chromate, or dichromate. The chromate treated layer may contain an element (in any form such as metal, alloy, oxide, nitride, and sulfide) of cobalt, iron, nickel, molybdenum, zinc, tantalum, copper, aluminum, phosphorous, tungsten, tin, arsenic and titanium etc. Specific examples of the chromate treated layer include a chromate treated layer which is treated with chromic acid anhydride or potassium dichromate aqueous solution and a chromate treated layer treated with a treatment liquid containing zinc and chromic acid anhydride or potassium dichromate.

A silane coupling agent used for formation of a silane coupling treated layer may be a silane coupling agent known in the art such as an amino silane coupling agent, an epoxy silane coupling agent, a mercapto silane coupling agent, a methacryloxy silane coupling agent, a vinyl silane coupling agent, an imidazole silane coupling agent, or a triazinesilane coupling agent. For the silane coupling agent, vinyl triethoxy silane, vinylphenyl trimethoxy silane, γ-methacryloxypropyltrimethoxysilane, γ-glycidoxypropyltrimethoxysilane, 4-glycidylbutyltrimethoxysilane, γ-aminopropyltriethoxysilane, N-β(aminoethyl)γ-aminopropyltrimethoxysilane, N-3-(4-(3-aminopropoxy)butoxy)propyl-3-aminopropyltrimethoxysilane, imidazole silane, triazinesilane, γ-mercaptopropyltrimethoxysilane, etc., can be used. In particular, an agent that is made by using an amino silane coupling agent or an epoxy silane coupling agent is preferable.

Here, an amino silane coupling agent may be selected from a group of N-(2-aminoethyl)-3-aminopropyltrimethoxysilane, 3-(N-styrylmethyl-2-aminoethylamino)propyltrimethoxysilane, 3-aminopropyltriethoxysilane, bis(2-hydroxyethyl)-3-aminopropyltriethoxysilane, aminopropyltrimethoxysilane, N-methylaminopropyltrimethoixysilane, N-phenylaminopropyltrimethoxysilane, N-(3-acryloxy-2-hydroxypropyl)-3-aminopropyltriethoxysinale, 4-aminobutyltriethoxysilane, (aminoethylaminomethyl)phenethyltrimethoxysilane, N-(2-aminoethyl-3-aminopropyl)trimethoxysilane, 6-aminohexylaminopropyl) trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, ω-aminoundecyl)trimethoxysilane, 3-(2-N-benzylaminoethylaminopropyl)trimethoxysilane, bis(2-hydroxyethyl)-3-aminopropyltriethoxysilane, (N,N-diethyl-3-aminopropyl) trimethoxysilane, N, N-dimethyl-3-aminopropyl) trimethoxysilane, N-methylaminopropyltrimethoxysilane, N-phenylaminopropyltrimethoxysilane, 3-(N-styrylmethyl-2-aminoethylamino)propyltrimethoxysilane, γ-aminopropyltiethoxysilane, N-β(aminoethyl)γ-aminopropyltrimethoxysilane, and N-3-(4-(3-aminopropoxy)butoxy)propyl-3-aminopropyltrimethoxysilane.

The silane coupling-treated layer is desirably provided within a range of 0.05 mg/m$^2$-200 mg/m$^2$, preferably 0.15 mg/m$^2$-20 mg/m$^2$, preferably 0.3 mg/m$^2$-2.0 mg/m$^2$ expressed in terms of silicon atoms. Within the above range, adhesions between a resin substrate and a metal foil can be improved. Note that for such a silane coupling agent, two or more kinds of agents may be mixed for use.

In addition, a surface treatment described in International Publication No. WO2008/053878, Japanese Patent Laid-Open Application No. 2008-111169, Japanese Patent No. 5024930, International Publication No. WO2006/028207, Japanese Patent No. 4828427, International Publication No. WO2006/134868, Japanese Patent No. 5046927, International Publication No. WO2007/105635, Japanese Patent No. 5180815, and Japanese Patent Laid-Open Application No. 2013-19056 can be applied to the face of the metal layer 1 on the insulating resin substrate side or a face on the metal layer 2 side of the laminate for printed wiring board.

A resin layer may be provided between the insulating resin substrate and the metal layer 1 or on the face on the metal layer 2 side of the laminate for printed wiring board according to the present invention. The resin layer may be a resin for adhesion, or in other words, an adhesive agent, may be a primer, or may be an insulating resin layer in a semi-cured state (B-stage), serving as an adhesive. The semi-cured state (B-stage) includes a state where the surface thereof is not sticky when touched by a finger, the insulating resin layers of this state can be laminated and stored, and a curing reaction proceeds when a heating treatment is further applied.

The resin layer may contain a thermosetting resin or may be formed of a thermoplastic resin. The resin layer may also contain a thermoplastic resin. The resin layer may contain a resin known in the art, a resin curing agent, a compound, a curing accelerator, a dielectric substance, a reaction catalyst, a crosslinking agent, a polymer, a prepreg, a skeletal material and so forth. The resin layer may also be formed by using the substances (resins, resin curing agents, compounds, curing accelerator, a dielectric substance, reaction catalyst, crosslinking agent, a polymer, a prepreg and a skeletal material, etc.) and/or by means of a method of forming the resin layer and/or by using an apparatus for forming the resin layer that are described, for example, in International Publication No. WO2008/004399, International Publication No. WO2008/053878, International Publication No. WO2009/084533, Japanese Patent Laid-Open Application No. 11-5828, Japanese Patent Laid-Open Application No. 11-140281, Japanese Patent No. 3184485, International Publication No. WO97/02728, Japanese Patent No. 3676375, Japanese Patent Laid-Open Application No. 2000-43188, Japanese Patent No. 3612594, Japanese Patent Laid-Open Application No. 2002-179772, Japanese Patent Laid-Open Application No. 2002-359444, Japanese Patent Laid-Open Application No. 2003-304068, Japanese Patent No. 3992225, Japanese Patent Laid-Open Application No. 2003-249739, Japanese Patent No. 4136509, Japanese Patent Laid-Open Application No. 2004-82687, Japanese Patent No. Application 2004-349654, Japanese Patent No. 4286060, Japanese Patent Laid-Open Application No. 2005-262506, Japanese Patent No. 4570070, Japanese Patent Laid-Open Application No. 2005-53218, Japanese Patent No. 3949676, Japanese Patent No. 4178415, International Publication No. WO2004/005588, Japanese Patent Laid-Open Application No. 2006-257153, Japanese Patent Laid-Open Application No. 2007-326923, Japanese Patent Laid-Open Application No. 2008-111169, Japanese Patent No. 5024930, International Publication No. WO2006/028207, Japanese Patent No. 4828427, Japanese Patent Laid-Open Application No. 2009-67029, International Publication No. WO2006/134868, Japanese Patent No. 5046927, Japanese Patent Laid-Open Application No. 2009-173017, International Publication No. WO2007/105635, Japanese Patent No. 5180815, International Publication No. WO2008/114858, International Publication No. WO2009/008471, Japanese Patent Laid-Open Application No. 2011-14727, International Publication No. WO2009/001850, International Publication No. WO2009/145179, International Publication No. WO2011/068157 and Japanese Patent Laid-Open Application No. 2013-19056.

(Printed Wiring Board, Electronic Device)

From the laminate according to the present invention, a printed wiring board can be manufactured by forming a circuit or circuits on the metal layer 1 and the metal layer 2 of the laminate. In addition, by mounting electronic component(s) on the printed wiring board, a printed circuit board can be made. In the present invention, "printed wiring board" includes a printed wiring board mounted with electronic components, a printed circuit board, and a printed baseplate. An electronic device may be made by using the printed wiring board, may be made by using the printed wiring board mounted with the electronic components, or may be made by using the printed baseplate mounted with the electronic components.

(Method of Manufacturing Printed Wiring Board)

In the following descriptions, some of examples of methods of manufacturing a printed wiring board by using the laminate for printed wiring board according to the present invention are provided.

One of the embodiments of the method of manufacturing a printed wiring board by using the laminate for printed wiring board according to the present invention includes a process of forming a circuit on the laminate for printed wiring board according to the present invention by means of any one of a semi-additive method, a partly additive method, a modified semi-additive method, and an embedding method.

In the present invention, the semi-additive method refers to a method of forming a conductive pattern by applying non-electrolytic plating onto an insulating substrate or a copper foil seed layer to form a thin plated layer, forming a pattern, and thereafter applying electroplating and etching.

Accordingly, in one of the embodiments of the method of manufacturing a printed wiring board according to the present invention using the semi-additive method, the method includes a step of preparing an insulating resin substrate, a step of forming through-holes or/and blind vias in the insulating resin substrate, a step of applying a desmear treatment to a region containing the through-holes or/and blind vias, a step of providing a metal layer 1 by providing an non-electrolytic plated layer on the region containing the insulating resin substrate, the through-holes or/and blind vias, a step of forming a plating resist on the non-electrolytic plated layer, a step of applying light to the plating resist to remove the plating resist of a region in which a circuit is to be formed, a step of forming an electrolytic plated layer on the region in which the circuit is to be formed, forming a metal layer 2, and obtaining the laminate for printed wiring board according to the present invention, a step of removing the plating resist, and a step of removing by flash etching etc. the non-electrolytic plated layer present in the region except the region in which the circuit is to be formed.

In the present invention, the partly additive method refers to a method of manufacturing a printed-wiring board by providing a catalyst nucleus on a substrate having a conductor layer and, when necessary, having holes for through-holes and via holes, forming a conductor circuit by etching, providing a solder resist or a plating resist, as needed, and thickening the conductor circuit, e.g., through-hole and via holes, by non-electrolytic plating.

Accordingly, in one of the embodiments of the method of manufacturing a printed wiring board according to the present invention using the partly additive method, the method includes a step of preparing a metal layer 1 and an insulating substrate, a step of stacking the metal layer 1 and the insulating resin substrate, a step of forming through-holes or/and blind vias in the metal layer 1 and the insulating resin substrate after stacking the metal layer 1 and the insulating resin substrate, a step of applying a desmear treatment to a region containing the through-hole or/and blind vias, a step of providing a catalyst nucleus to the region containing the through-hole or/and blind vias, a step of providing an etching resist to the metal layer 1, a step of forming a circuit pattern by applying light to the etching resist, a step of forming a circuit by removing the metal layer 1 and the catalyst nucleus by an etching method using a corrosive solution such as an acid, or a plasma method etc., a step of removing the etching resist, a step of forming a solder resist or a plating resist on the surface of the insulating resin substrate exposed by removing the metal layer 1 and the catalyst nucleus by an etching method using a corrosive solution such as an acid, or a plasma method etc., and a step of providing a metal layer 2 that is a non-electrolytic plated layer and/or an electrolytic plated layer in a region in which neither the solder resist nor plating resist is provided to obtain the laminate for printed wiring board according to the present invention.

In the present invention, the modified semi-additive method refers to a method of forming a circuit on an insulating resin substrate by stacking a metal layer 1 that is a metal foil etc. on an insulating layer, protecting a non-circuit forming portion with a plating resist, thickening a circuit forming portion with a metal layer 2 such as copper by electrolytic plating, removing the resist and removing the metal layer 1 of the region except the circuit forming portion by (flash) etching.

Accordingly, in one of the embodiments of the method of manufacturing a printed wiring board according to the present invention using the modified semi-additive method, the method includes a step of preparing a metal layer 1 and an insulating resin substrate, a step of forming through-holes or/and blind vias in the metal layer 1 and the insulating resin substrate, a step of applying a desmear treatment to a region containing the through-holes or/and blind vias, a step of providing an non-electrolytic plated layer on the region containing the through-holes or/and blind vias, a step of forming a plating resist on a surface of the metal layer 1, a step of forming a circuit that is a metal layer 2 by electroplating after the plating resist is formed and manufacturing the laminate for printed wiring board according to the present invention, a step of removing the plating resist, and a step of removing by flash etching the metal layer 1 exposed by removing the plating resist.

In another one of the embodiments of the method of manufacturing a printed wiring board according to the present invention using the modified semi-additive method, the method includes a step of preparing a metal layer 1 and an insulating resin substrate, a step of stacking the metal layer 1 and the insulating resin substrate, a step of forming a plating resist on the metal layer 1, a step of applying light to the plating resist to remove the plating resist in a region in which a circuit is to be formed, a step of forming by electroplating a circuit that is a metal layer 2 on the region in which the circuit is to be formed and the plating resist has been removed and manufacturing the laminate for printed wiring board according to the present invention, a step of removing the plating resist, and a step of removing by flash etching etc. the metal layer 1 in the region except the region in which the circuit is to be formed.

Note that the step of forming through-holes or/and blind vias and the following desmear step may not need to be carried out.

In the present invention, the embedding method refers to a method of manufacturing an ETS (Embedded Trace Substrate) by forming a plated circuit of a metal layer 1 on a surface of a metal layer 2, stacking an insulating resin layer by providing an embedding resin on the metal layer 2 so as to cover the formed plated circuit (metal layer 1) (so as to bury the formed plated circuit (metal layer 1)), and exposing the metal layer 1 by removing the metal layer 2. Note that the above-described method of manufacturing an ETS may include, when necessary, drilling holes on the insulating resin substrate at prescribed locations, forming blind vias by exposing the plated circuit (metal layer 1), and connecting circuits and wiring between plural layers of the laminate.

One of the embodiments of the method of manufacturing a printed wiring board according to the present invention by using the embedding method is provide below.

Step 1: A metal layer 2 is prepared.
Step 2: Next, a resist is applied to a surface of the metal layer 2, light exposure and development are performed, and the resist is etched to be a prescribed shape.
Step 3: After forming a metal layer 1 that is a plated circuit, the resist is removed so as to forma plated circuit (metal layer 1) of a prescribed shape.
Step 4: Next, an insulating resin layer is laminated on the surface of the metal layer 2 by providing an embedding resin so as to cover the formed plated circuit (metal layer 1) (so as to bury the formed plated circuit (metal layer 1)) and the laminate for printed wiring board according to the present invention is manufactured. Afterwards, another metal layer is attached.
Step 5: Next, a laser-drilled hole is made on a prescribed position of the insulating resin substrate and another metal layer so as to expose the plated circuit (metal layer 1) to form a blind via.
Step 6: The blind via is filled with copper to form a via fill. Next, on the via fill, another plated circuit is formed in a manner described in the above Steps 2 and 3.
Step 7: Next, the metal layer 2 is removed by flash etching, and the surface of the plated circuit (metal layer 1) in the insulating resin substrate is exposed.
Step 8: Next, a bump is formed on the plated circuit (metal layer 1) in the insulating resin substrate and a copper pillar is formed on the bump. In this manner, a printed wiring board that uses the laminate for printed wiring board according to the present invention is produced.

According to the above-described method of manufacturing a printed wiring board, because of a structure in which the plated circuit (metal layer 1) is embedded in the insulating resin substrate, the plated circuit (metal layer 1) is protected by the insulating resin substrate at the time of removing the metal layer by flash etching as in Step 7 as an example, the shape of the plated circuit (metal layer 1) can be therefore maintained, and as a result, formation of microcircuits is facilitated. In addition, because the plated circuit (metal layer 1) is protected by the insulating resin substrate, migration resistance is increased, and conductivity of circuit wiring is favorably controlled. For that reason, formation of microcircuits is facilitated. As described in Steps 7 and 8, when the metal layer 2 is removed by flash etching, the exposed surface of the plated circuit is dented and becomes lower than the insulating resin substrate, and therefore, the bump on the plated circuit (metal layer 1) and the copper pillar on the bump are readily formed. As a result, manufacturing efficiency is improved.

Note that as the embedding resin (resin) (insulating resin substrate), a resin known in the art and a prepreg can be used. For example, BT (bismaleimide triazine) resin and a prepreg, which is glass cloth impregnated with a BT resin, ABF film and ABF manufactured by Ajinomoto Fine-Techno Co., Inc. can be used. As the embedding resin (resin), the resin layer and/or resin and/or prepreg described in the specification can be used.

EXAMPLES

In the following descriptions, experimental examples are provided as Examples of the present invention and Comparative Examples. These Examples are provided to give a better understanding of the present invention and its advantages, and therefore these Examples should not be construed as limiting the present invention.

(Production of Laminate for Printed Wiring Board)

In Examples 1-9 and Comparative Examples 1-4, a polyimide resin (a Upilex 25VT, BPDA (biphenyl-tetracarboxylic acid dianhydride) base (specifically, BPDA-PDA (para-phenylenediamine) base) polyimide resin substrate that is a product of Ube Industries, Ltd.) with a 25-µm-thick adhesion layer (thermal adhesion layer) was used as the insulating resin substrate, and a tough pitch copper (TPC) or an oxygen-free copper (OFC) to which elements of composition provided in Table 1, or a rolled copper foil of a tough pitch copper or an oxygen-free copper (the thickness of the copper foil is provide in Table 1) was used as the metal layer 1. Note that the rolled copper foil was made to have the thickness provided in Table 1 by casting an ingot from the tough pitch copper or the oxygen-free copper to which elements of composition provided in Table 1 is added, by performing hot rolling at 800° C. or higher until the ingot becomes 10 mm thick, removing oxidized scales on the surface, repeating cold rolling and annealing, and finally performing final cold rolling. The degree of processing in the final cold rolling was set to 99%.

Note that "TPC+Ag 200 ppm" in the composition field in Table 1 indicates that 200 mass ppm of Ag is added to a tough pitch copper (TPC) of JIS-H3100 (alloy number C1100). "OFC+Ag 100 ppm+Sn 30 ppm" in the composition field in Table 1 indicates that 100 mass ppm of Ag and 30 mass ppm of Sn are added to an oxygen-free copper (OFC) of JIS-H3100 (alloy number C1020). Note that the final cold rolling was performed 10-15 times (passes) by using a mill roll having the surface roughness provided in Table 1. The surface roughness of the roll is the same in each of the passes of the final cold rolling.

Next, in Examples 1-9 and Comparative Examples 1-3, rolled copper foils were arranged on both sides of the polyimide resin and were bonded by thermocompression at 300° C. for 30 minutes. The copper foil on one of the both sides is removed by employing full etching with a copper chloride etchant solution. Afterwards, in Examples 1-9 and Comparative Examples 2 and 3, the copper foil on the other side was etched by means of soft etching so as to have the thickness provided in Table 1. In Comparative Example 1, the soft etching was not carried out to the copper foil on the other side. The soft etching solution SE-07 that is a product of MITSUBISHI GAS CHEMICAL COMPANY, INC. was used for the soft etching and the soft etching was performed at 35° C. Note that the soft etching can be performed by employing the technique known in the art by using a soft etching solution known in the art.

In Comparative Example 4, an electrolytic copper foil was manufactured by means of electrolytic deposition of copper on a titanium drum from copper sulfate plating bath. This electrolysis was adjusted so that the thickness of the electrolytic deposition becomes 18 μm. The conditions of this electrolysis are provided below.

Composition of electrolytic solution: Cu 50 g/L, H2SO4 100 g/L
Electrolysis time: 35 minutes
Temperature of electrolytic solution: 60° C.
Current density: 8 A/dm$^2$ Next, a polyimide resin (a Upilex 25VT, BPDA (biphenyltetracarboxylic acid dianhydride) base (specifically, BPDA-PDA (para-phenylenediamine) base) polyimide resin substrate that is a product of Ube Industries, Ltd.) with a 25-μm-thick adhesion layer (thermal adhesion layer) was used as the insulating resin substrate, the electrolytic copper foils were placed on both sides of the polyimide resin, and the electrolytic copper foils and the polyimide resin were bonded by thermocompression at 300° C. for 30 minutes. The copper foil on one of the both sides was removed by employing full etching with a copper chloride etchant solution. Afterwards, the copper foil on the other side was etched by means of soft etching so as to have the thickness provided in Table 1. The soft etching was not carried out to the copper foil on the other side. The soft etching solution SE-07 that is a product of MITSUBISHI GAS CHEMICAL COMPANY, INC. was used for the soft etching and the soft etching was performed at 35° C. Note that the soft etching can be performed by employing the technique known in the art by using a soft etching solution known in the art.

<Laminate for Printed Wiring Board to Evaluate Bending Endurance>

Next, in Examples 1-9 and Comparative Examples 1 and 2, a copper layer (metal layer 2) was formed under the following plating conditions so that the copper layer has the thickness provided in Table 1 over the rolled copper foil bonded on one side of the polyimide resin.

Composition of plating solution: copper sulfate Cu 100 g/L, H$_2$SO$_4$ 180 g/L, Cl$^-$ 50 ppm
Additive to plating solution: Cu-BRITE RF-MU produced by JCU 10 mL//L, Cu-BRITE RF-B produced by JCU 1 mL/L
Temperature of plating solution: 25° C.
Current density: 0.5 A/dm$^2$ In Comparative Example 3, a copper layer (metal layer 2) was formed under the following plating conditions so that the copper layer has the thickness provided in Table 1 over the rolled copper foil bonded on one side of the polyimide resin.

Composition of plating solution: copper sulfate Cu 100 g/L, H$_2$SO$_4$ 180 g/L, Cl$^-$ 50 ppm
Additive to plating solution: Cu-BRITE RF-MU produced by JCU 10 mL//L, Cu-BRITE RF-B produced by JCU 1 mL/L
Temperature of plating solution: 25° C.
Current density: 5.0 A/dm$^2$ <Laminate for Printed Wiring Board to Form Microcircuit>

Next, in Examples 1-9 and Comparative Examples 1-4, a copper layer 'metal layer 2) with the thickness provided in Table 1 was formed by forming a patterned copper plated layer on the rolled copper foil or the electrolytic copper foil bonded on one side of the polyimide resin so as to be L/S=25 μm/25 μm under the plating conditions that are the same as the conditions when the copper layer (metal layer 2) was formed on the rolled copper foil or the electrolytic copper foil at the time of the above formation of the laminate for printed wiring board to evaluate the bending endurance. Note that when the metal layer 1 was a rolled copper foil, the patterned copper plated layer was provided so that the wiring of the copper plating was formed in a direction parallel to the rolling direction, and when the metal layer 1 was an electrolytic copper foil, the patterned copper plated layer was provided so that the wiring of the copper plating was formed in a direction parallel to the MD direction (a direction to which the electrolytic copper foil moves in an electrolytic copper foil manufacturing equipment). Note that the "rolling direction" refers to a direction to which the material to be rolled moves in a rolling mill.

In Example 3, a roughened layer, a heat-resistant layer, a rustproofing layer, a chromate treated layer, and a silane coupling-treated layer were formed in this order on the surface of the metal layer 1 on the side to be laminated on the insulating resin substrate.

Roughened Layer
Ternary (copper-cobalt-nickel) alloy plating:
Composition of plating bath: Cu 10-20 g/L, Co 1-10 g/L, Ni 1-10 g/L
pH: 1-4
Temperature: 30-50° C.
Current density D$_k$: 30-45 A/dm$^2$
Plating time: 0.2-1.5 second Note that in the treatment solutions used in the desmear treatment, electrolysis, surface treatment or plating employed in the present invention, the balance is water unless otherwise specified.

Heat-Resistant Layer
Cobalt-Nickel Alloy Plating:
Composition of plating bath: Co 1-20 g/L, Ni 1-20 g/L
pH: 1.5-3.5
Temperature: 30-80° C.
Current density D$_k$: 1.0-20.0 A/dm$^2$
Plating time: 0.5-4 seconds Rustproofing Layer
Nickel-Zinc Alloy Plating:
Composition of plating bath: Zn 1-20 g/L, Ni 10-20 g/L
pH: 3-4
Temperature: 50-60° C.
Current density D$_k$: 0.1-1.0 A/dm$^2$
Plating time: 1-3 seconds Chromate Treated Layer
An electrolytic chromate treatment was performed under the following conditions.
K$_2$Cr$_2$O$_7$: 1-10 g/L
Temperature: 20-60° C.
Current density D$_k$: 0.1-1.0 A/dm$^2$
Treatment time: 1-5 seconds Silane Coupling-Treated Layer
The layer was formed by applying the following silane coupling treatment solution.
Type of silane: N-2-(amino ethyl)-3-aminopropyltrimethoxysilane
Concentration of silane: 0.5 vol %
Temperature: 10-60° C.
Treatment time: 1-5 seconds (Evaluation of Laminate for Printed Wiring Board)
<Area Ratio of Processed Cross Section>

Of the laminate for printed wiring board (laminate for printed wiring board to evaluate bending endurance), a cross section was formed and polished by means of ion milling using IM4000 plus made by Hitachi High-Tech Fielding Corporation. When the metal layer 1 was a rolled copper foil, a cross section was formed in a direction parallel to the rolling direction and a direction parallel to the through-thickness direction, and when the metal layer 1 was an electrolytic copper foil, a cross section was formed in a direction parallel to the MD direction and a direction parallel to the through-thickness direction. Note that the ion milling was performed to such a degree that the crystal grains on a cross section can be determinately detected. Here, instead of the ion milling, the cross section can be polished by using a cross section polisher. After the cross section was polished, the cross section was placed under an Analytical UHR Schottky Emission Scanning Electron Microscope SU-70 made by Hitachi High-Technologies Corporation and was studied by EBSD (Electron Backscatter Diffraction). As the software of the analysis, OIM ver. 5.31 (made of TSL Solutions) attached to the EBSD equipment.

Acceleration voltage: 15 kV
Tilt angle: 70°
Step width: 0.2 μm
Measurement range: A range surrounded by a quadrangle that has 40 μm in a direction parallel to the metal layer of the laminate and the length that covers the entire thickness of the metal layer 1 and the metal layer 2 in the thickness direction of the metal layer of the laminate was observed.

From the obtained EBSD result, the metal layer 1 and the metal layer 2 have plural crystal grains at the processed cross section. Some of these plural crystal grains are crystal grains of which the difference in angle of the <100> crystal direction from a perpendicular of the processed cross section is 15° or less. A ratio (area ratio) of the total value of the area of such crystal grains to the total area of the plural crystal grains (corresponding to the area of the above-described measurement range) was calculated by the above-described software. The ratio (area ratio) was calculated for a case in which only the metal layer 1 was considered and a case in which both the metal layer 1 and the metal layer 2 were considered. Note that three sites were observed and the area ratio was an average value of the analysis results of the three sites. Also note that the above-described cross section is a cross section in a direction perpendicular to the direction to which the bending axis of the 180° bending extends in the evaluation of the bending endurance that is described later.

Note that after forming a circuit (wiring) of L/S=25 μm/25 μm on the metal layer 1 and the metal layer 2 of the laminate for printed wiring board (laminate for printed wiring board to form a microcircuit), a cross section of the circuit (wiring) in a direction parallel to the thickness direction of the circuit (wiring) and in a direction parallel to the direction that the circuit (wiring) extends and a cross section of the circuit (wiring) in a direction parallel to the thickness direction of the circuit (wiring) and in a direction parallel to the width direction of the circuit (wiring) were polished by means of ion milling using IM4000 plus made by Hitachi High-Tech Fielding Corporation by employing the method that is the same as the evaluation of the area ratio of the processed cross section. Afterwards, the processed cross section was studied by EBSD. It was found from the obtained EBSD result that the metal layer 1 and the metal layer 2 have plural crystal grains on the processed cross section. Of the plural crystal grains, a ratio (area ratio) of the total value of the area of crystal grains of which the difference in angle of the <100> crystal direction from a perpendicular of the processed cross section is 15° or less to the total area of the plural crystal grains was obtained. The obtained value was similar to the area ratio of the processed cross section of the laminate for printed wiring board to evaluate bending endurance was measured.

<Thickness Ratio of Processed Cross Section>

A cross section parallel to the thickness direction of the metal layer 1 and the metal layer 2 of the laminate for printed wiring board was processed by means of ion milling. Afterwards a sample was placed under SMI 3050 made by SII Nano Technology Inc., the thickness of each of the metal layer 1 and the metal layer 2 was measured at 10 sites at 5 μm intervals by FIB-SIM observation, and the resulting arithmetic mean value was regarded as the thickness of each of the metal layer 1 and the metal layer 2. When the boundary of the metal layer 1 and the metal layer 2 was not clear, the thickness of each of the metal layer 1 and the metal layer 2 may be measured by FIB-SIM observation after processing the cross section of the laminate by means of ion milling and immersing the cross section in a chemical polishing solution (hydrogen peroxide 1 mL+aqueous ammonia 29 mL+water 70 mL) for 2-5 seconds. By immersing the chemical polishing solution, the boundary of the metal laminate is eroded and the determination of the boundary is facilitated.

<Bending Endurance>

The 180° bending of the laminate for printed wiring board was repeated and the number of times the 180° bending was repeated was counted until the copper foil cracked. Regarding the presence or absence of the crack, the surface of the copper foil (the outer surface of the bended portion) was observed with a CCD camera after each bending. The 180° bending was performed as illustrated in FIG. 1.

Firstly, a 12.7 mm×100 mm strip of a sample piece was cut out of the copper foil in a manner that the rolling direction or the MD direction (a direction to which the electrolytic copper foil moves in an electrolytic copper foil manufacturing equipment) of the copper foil became the longitudinal direction of the strip. This sample piece S1 was bent in U-shape at the center so that one side of the longitudinal direction edge was folded to another side, and the sample piece S1 was placed under a compression tester (a universal tester AGS-5 kN made by SHIMADZU CORPORATION) in a manner that the longitudinal direction of the sample piece S1 in an inverted C-shape was horizontal (parallel to the surface of the stage from the front view) (FIG. 1(a)). More specifically, the sample piece S1 was placed on a stage 12 and the crosshead 11 over the sample piece S1 was lowered at a speed of 50 mm/minute, applying a load of 98 kN (10 kgf). The load was applied for 5 seconds to flatly crush the sample piece S1. Afterwards, the crosshead 11 was uplifted, the sample piece (referred to as a sample piece S2) with a crushed U-shape was taken out of the stage, and the sample piece was turned around so that the longitudinal direction extends vertically to look like an inverted V-shape (such an sample piece was referred to as a sample piece S3) (FIG. 1(b)). The sample pieces S2 and S3 had a bend C that was originally U-shaped but was crushed and sharpened.

Next, the sample piece S3 was placed on the stage 12 of the universal tester so that the bend C faced upward, and the crosshead 11 over the bend C was lowered at the same speed as the speed described above, applying the same load as the load described above. The load was applied for 5 seconds to flatly crush the sample piece S3 (FIGS. 1(c) and (d)). Afterwards, the crosshead 11 was uplifted and the bend C was crushed and became nearly flat. Such a sample piece (referred to as a sample piece S4) was taken out of the stage, an outer surface Sk of the bended portion that includes a prescribed area with the bend C at the center was observed, and presence/absence of a crack was determined (FIG. 1(e)). The number of times that the sample piece was bent until presence of a crack was observed was counted. In the evaluation criteria of the bending endurance, when the number of times that the sample piece was bent until presence of a crack was observed was four times or more, the bending endurance was evaluated as "OO", when the number of times that the sample piece was bent until presence of a crack was observed was three times, the bending endurance was evaluated as "O", and when the number of times that the sample piece was bent until presence of a crack was observed was two time or less, the bending endurance was evaluated as "X".

<Microcircuit Formability>

The metal layer 2 was formed by forming a patterned copper plated layer of L/S=25 μm×25 μm on the surface of the metal layer 1 of the laminate. Next, unnecessary portions of the metal layer 1 were removed by means of flash etching and a circuit (wiring) was formed.

Microcircuit Evaluation 1

Five microscope fields in an area of 200 μm×200 μm were observed and circuit formability was evaluated. In the five fields, when no short-circuit was found and when the number of convex portions having 50 μm or larger in diameter was on average 0.2/(40000 μm$^2$) or less, the microcircuit was evaluated as "OO". Here, the diameter of the smallest circle surrounding a convex portion was regarded as the diameter of the convex portion. In the five fields, when no short-circuit was found, when the number of convex portions having 50 μm or larger in diameter was on average 0.2/(40000 μm$^2$) or more but less than 1/(40000 μm$^2$), the microcircuit was evaluated as "O". In the five fields, when at least one short-circuit was found, or when the number of convex portions having 50 μm or larger in diameter was on average 1/(40000 μm$^2$) or more, the microcircuit was evaluated as "X".

Microcircuit Evaluation 2

The difference (μm) between the maximum value and the minimum value in the width of the bottom edge of a circuit in the top view of the circuit was measured at five sites and the average value of the five sites was calculated. When the difference between the maximum value and the minimum value was 4 μm or less, the microcircuit was determined to have good circuit linearity, and the microcircuit was evaluated as "OO". When the difference between the maximum value and the minimum value was over 4 μm but 6 μm or less, the microcircuit was evaluated as "O". When the difference between the maximum value and the minimum value was over 6 μm but 7 μm or less, the microcircuit was evaluated as "Δ". When the difference between the maximum value and the minimum value was over 7 μm, the microcircuit was evaluated as "X". The conditions and evaluation results of each testing are provided in Table 1 and Table 2.

TABLE 1

| | METAL LAYER 1 TYPE | SURFACE ROUGHNESS OF MILL ROLL IN FINAL COLD ROLLING (Ra: μm) | COPPER FOIL USED FOR METAL LAYER 1 | |
|---|---|---|---|---|
| | | | COMPOSITION OF ADDED ELEMENT(mass ppm) | THICKNESS (μm) |
| EXAMPLE 1 | ROLLED COPPER FOIL | 0.090 | TPC + Ag200 ppm | 9 |
| EXAMPLE 2 | ROLLED COPPER FOIL | 0.033 | OFC + Ag100 ppm + Sn30 ppm | 12 |
| EXAMPLE 3 | ROLLED COPPER FOIL | 0.030 | OFC | 18 |
| EXAMPLE 4 | ROLLED COPPER FOIL | 0.159 | TPC | 35 |
| EXAMPLE 5 | ROLLED COPPER FOIL | 0.034 | OFC + Ag100 ppm + B10 ppm + P10 ppm + Ni20 ppm | 12 |
| EXAMPLE 6 | ROLLED COPPER FOIL | 0.034 | OFC + Ti10 ppm + Cr10 ppm + Zr10 ppm + Mo50 ppm | 12 |
| EXAMPLE 7 | ROLLED COPPER FOIL | 0.034 | TPC + Zn100 ppm + Mn50 ppm Ag150 ppm | 12 |
| EXAMPLE 8 | ROLLED COPPER FOIL | 0.034 | OFC + V10 ppm + Si10 ppm + Mg10 ppm + In50 ppm | 12 |
| EXAMPLE 9 | ROLLED COPPER FOIL | 0.034 | TPC + Au50 ppm + Pd50 ppm | 12 |
| COMPARATIVE EXAMPLE 1 | ROLLED COPPER FOIL | 0.032 | TPC + Ag200 ppm | 18 |
| COMPARATIVE EXAMPLE 2 | ROLLED COPPER FOIL | 0.030 | TPC + Ag200 ppm | 18 |
| COMPARATIVE EXAMPLE 3 | ROLLED COPPER FOIL | 0.230 | TPC | 18 |
| COMPARATIVE EXAMPLE 4 | ELECTROLYTIC COPPER FOIL | — | — | 18 |

| | METAL LAYER 1 AFTER ETCHING THICKNESS (μm) | METAL LAYER 2 THICKNESS (μm) | THICKNESS RATIO THICKNESS OF METAL LAYER 2(μm)/THICKNESS OF METAL LAYER 1(μm) |
|---|---|---|---|
| EXAMPLE 1 | 3.1 | 3.0 | 1.0 |
| EXAMPLE 2 | 2.5 | 3.7 | 1.5 |
| EXAMPLE 3 | 3.0 | 3.1 | 1.0 |
| EXAMPLE 4 | 3.2 | 3.2 | 1.0 |
| EXAMPLE 5 | 2.9 | 2.9 | 1.0 |
| EXAMPLE 6 | 1.0 | 2.9 | 2.9 |

TABLE 1-continued

| | | | |
|---|---|---|---|
| EXAMPLE 7 | 3.0 | 9.1 | 3.0 |
| EXAMPLE 8 | 2.9 | 2.1 | 0.7 |
| EXAMPLE 9 | 1.5 | 12.2 | 8.1 |
| COMPARATIVE EXAMPLE 1 | 18 | 9.9 | 0.5 |
| COMPARATIVE EXAMPLE 2 | 3.0 | 3.0 | 1.0 |
| COMPARATIVE EXAMPLE 3 | 3.0 | 3.0 | 1.0 |
| COMPARATIVE EXAMPLE 4 | 2.4 | 3.6 | 1.5 |

TABLE 2

| | METAL LAYER 1 + METAL LAYER 2 AREA RATIO OF CRYSTAL GRAIN OF WHICH DIFFERENCE IN ANGLE OF <100>CRYSTAL DIRECTION FROM PERPENDICULAR OF CROSS SECTION IS 15° OR LESS (%) | METAL LAYER 1 AREA RATIO OF CRYSTAL GRAIN OF WHICH DIFFERENCE IN ANGLE OF <100>CRYSTAL DIRECTION FROM PERPENDICULAR OF CROSS SECTION IS 15° OR LESS (%) | NUMBER OF TIMES OF BENDING UNTIL CRACK | MICROCIRCUIT EVALUATION 1 CIRCUIT WIDTH/ SPACE WIDTH L/S = 25/25 μm | MICROCIRCUIT EVALUATION 2 CIRCUIT WIDTH/ SPACE WIDTH L/S = 25/25 μm |
|---|---|---|---|---|---|
| EXAMPLE 1 | 37.9 | 69.4 | 4 (∘∘) | ∘∘ | ∘ |
| EXAMPLE 2 | 93.2 | 98.3 | 5 (∘∘) | ∘ | ∘∘ |
| EXAMPLE 3 | 77.1 | 96.4 | 4 (∘∘) | ∘∘ | ∘ |
| EXAMPLE 4 | 15.2 | 41.3 | 3 (∘) | ∘∘ | ∘ |
| EXAMPLE 5 | 43.5 | 97.2 | 4 (∘∘) | ∘∘ | ∘ |
| EXAMPLE 6 | 42.6 | 95.2 | 4 (∘∘) | ∘∘ | ∘∘ |
| EXAMPLE 7 | 41.1 | 97.5 | 4 (∘∘) | ∘∘ | ∘∘ |
| EXAMPLE 8 | 42.9 | 96.1 | 4 (∘∘) | ∘∘ | Δ |
| EXAMPLE 9 | 40.3 | 96.9 | 4 (∘∘) | ∘∘ | ∘∘ |
| COMPARATIVE EXAMPLE 1 | 97 | 98.2 | 3 (∘) | x | x |
| COMPARATIVE EXAMPLE 2 | 98 | 99 | 4 (∘∘) | x | x |
| COMPARATIVE EXAMPLE 3 | 13 | 19 | 1 (x) | ∘∘ | ∘ |
| COMPARATIVE EXAMPLE 4 | 10 | 15 | 0 (x) | ∘∘ | ∘∘ |

(Evaluation Result)

In each of Examples 1-9, when a cross section that is parallel to the thickness direction of the laminate is processed by means of ion milling and the cross sections of the metal layer 1 and the metal layer 2 were observed with EBSD, the metal layer 1 and the metal layer 2 had plural crystal grains on the processed cross sections, and in the processed cross section, the metal layer 1 and the metal layer 2 had plural crystal grains, and the area ratio of the total area of at least one crystal grain of which a difference in angle of a <100> crystal direction from a perpendicular of the processed cross section is 15° or less from among the plural crystal grains of the metal layer 1 and the plural crystal grains of the metal layer 2 to the total area of the plural crystal grains of the metal layer 1 and the plural crystal grains of the metal layer 2 was 15% or higher and less than 97%. Therefore, the bending endurance and the circuit formability were evaluated as favorable.

On the other hand, in Comparative Examples 1 and 2, the area ratio of the total area of the crystal grains of which the difference in angle of the <100> crystal direction from the perpendicular of the processed cross section is 15° or less to the total area of the plural crystal grains was 97% or higher in the metal layer 1 and the metal layer 2. Therefore, the circuit formability was evaluated as unfavorable.

In Comparative Examples 3 and 4, the area ratio of the total area of the crystal grains of which the difference in angle of the <100> crystal direction from the perpendicular of the processed cross section is 15° or less to the total area of the plural crystal grains was less than 15% in the metal layer 1 and the metal layer 2. Therefore, the circuit formability was evaluated as unfavorable.

EXPLANATION OF CODES 11 crosshead
12 stage
S1 sample piece
S2 sample piece
S3 sample piece
S4 sample piece
C bend
Sk outer surface of bended portion

The invention claimed is:

1. A laminate for a printed circuit board,
    wherein the laminate is used in a printed circuit board manufacturing method that includes a step of forming a circuit by any one of a semi-additive method, a partly additive method, a modified semi-additive method, and an embedding method, and wherein the laminate includes an insulating resin substrate, a metal layer 1 and a metal layer 2 in this order, and when a cross section parallel to a thickness direction of the laminate is processed by means of ion milling and the cross section of the metal layer 1 and the metal layer 2 is observed with EBSD (Electron Backscatter Diffraction), in the cross section, each of the metal layer 1 and the metal layer 2 has one or a plurality of crystal grains, and an area ratio of a total area of at least one crystal grain of which a difference in angle of a <100> crystal direction from a perpendicular of the cross section is 15° or less from among the one or plurality of crystal grains of the metal layer 1 and the one or plurality of crystal grains of the metal layer 2 to a total area of the one or plurality of crystal grains in the metal layer 1 and the one or plurality of crystal grains in the metal layer 2 is 15% or higher and less than 97%.

2. The laminate for the printed circuit board according to claim 1,
wherein when the cross section parallel to the thickness direction of the laminate is processed by means of ion milling and the cross section of the metal layer 1 is observed with EBSD, in the cross section, the metal layer 1 has one or a plurality of crystal grains, an area ratio of an area of at least one crystal grain of which a difference in angle of a <100> crystal direction from a perpendicular of the cross section is 15° or less from among the one or plurality of crystal grains in the metal layer 1 to a total area of the one or plurality of crystal grains in the metal layer 1 is 40% or higher.

3. The laminate for the printed wiring board according to claim 2,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 15% or higher and 90% or less.

4. The laminate for the printed wiring board according to claim 3,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 18% or higher and less than 90%.

5. The laminate for the printed circuit board according to claim 4,
wherein when the cross section parallel to the thickness direction of the laminate is processed by means of ion milling and the cross section of the metal layer 1 and the metal layer 2 is observed, a thickness of the metal layer 2 is 1.3 times or more thicker than a thickness of the metal layer 1.

6. The laminate for the printed circuit board according to claim 5,
wherein the laminate comprises a circuit or wiring, and
wherein when the cross section parallel to the thickness direction of the circuit or wiring is processed by means of ion milling and the cross section is observed with EBSD, in the cross section, the circuit or wiring has a plurality of crystal grains, and an area ratio of a total area of at least one crystal grain of which a difference in angle of a <100> crystal direction from a perpendicular of the cross section from among the plurality of crystal grains in the circuit or wiring is 15° or less to a total area of the plurality of crystal grains in the circuit or wiring is 15% or higher and less than 97%.

7. The laminate for the printed circuit board according to claim 3,
wherein when the cross section parallel to the thickness direction of the laminate is processed by means of ion milling and the cross section of the metal layer 1 and the metal layer 2 is observed, a thickness of the metal layer 2 is 1.1 times or more thicker than a thickness of the metal layer 1.

8. The laminate for the printed wiring board according to claim 2,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 18% or higher and less than 97%.

9. The laminate for the printed wiring board according to claim 1,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 15% or higher and 90% or less.

10. The laminate for the printed wiring board according to claim 9,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 18% or higher and less than 90%.

11. The laminate for the printed wiring board according to claim 1,
wherein the area ratio of the total area of the at least one crystal grain of which the difference in angle of the <100> crystal direction from the perpendicular of the processed cross section is 15° or less from among the one or plurality of crystal grains in the metal layer 1 and the one or plurality of crystal grains in the metal layer 2 to the total area of the one or plurality of crystal grains in the metal layer 1 and the one or plurality of crystal grains in the metal layer 2 is 18% or higher and less than 97%.

12. The laminate for the printed circuit board according to claim 1,
wherein when the cross section parallel to the thickness direction of the laminate is processed by means of ion milling and the cross section of the metal layer 1 and the metal layer 2 is observed, a thickness of the metal layer 2 is the same as or thicker than a thickness of the metal layer 1.

13. The laminate for the printed circuit board according to claim 1,
wherein the metal layer 1 is a rolled copper foil.

14. The laminate for the printed circuit board according to claim 1,
wherein the cross section parallel to the thickness direction of the laminate is a cross section parallel to the thickness direction of the laminate and parallel to a rolling direction when the metal layer 1 is a rolled copper foil, or is a cross section parallel to the thickness direction of the laminate and parallel to an MD direction when the metal layer 1 is an electrolytic copper foil.

15. The laminate for the printed circuit board according to claim 1,
wherein the laminate for printed wiring board is bent for use, and
wherein the cross section parallel to the thickness direction of the laminate is parallel to the thickness direction of the laminate and when the laminate for printed wiring board is bent for use, the cross section corresponds to a cross section perpendicular to a direction to which an bending axis extends.

16. The laminate for the printed circuit board according to claim 1,
wherein the laminate comprises a circuit or wiring, and
wherein when the cross section parallel to the thickness direction of the circuit or wiring is processed by means of ion milling and the cross section is observed with EBSD, in the cross section, the circuit or wiring has a plurality of crystal grains, and an area ratio of a total area of at least one crystal grain of which a difference in angle of a <100> crystal direction from a perpendicular of the cross section from among the plurality of crystal grains in the circuit or wiring is 15° or less to a total area of the plurality of crystal grains in the circuit or wiring is 15% or higher and less than 97%.

17. The laminate for the printed wiring board according to claim 16,
wherein the cross section parallel to the thickness direction of the circuit or wiring is a cross section parallel to the thickness direction of the circuit or wiring and parallel to a direction to which the circuit or wiring extends, or is a cross section parallel to the thickness direction of the circuit or wiring and parallel to a width direction of the circuit or wiring.

18. The laminate for the printed circuit board according to claim 16,
wherein the laminate for printed wiring board is bent for use, and
wherein the cross section parallel to the thickness direction of the circuit or wiring is parallel to the thickness direction of the circuit or wiring and when the laminate for printed wiring board is bent for use, the cross section corresponds to a cross section perpendicular to a direction to which an bending axis extends.

\* \* \* \* \*